（12） United States Patent
Kitamura

(10) Patent No.: US 8,901,856 B2
(45) Date of Patent: Dec. 2, 2014

(54) DETECTION CIRCUIT, POWER CIRCUIT, AND LUMINAIRE

(71) Applicant: Toshiba Lighting & Technology Corporation, Yokosuka (JP)

(72) Inventor: Noriyuki Kitamura, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 0 days.

(21) Appl. No.: 14/024,710

(22) Filed: Sep. 12, 2013

(65) Prior Publication Data

US 2014/0285106 A1      Sep. 25, 2014

(30) Foreign Application Priority Data

Mar. 19, 2013   (JP) .................................. 2013-057370

(51) Int. Cl.
*H05B 37/02*      (2006.01)
*H05B 33/08*      (2006.01)
*G01R 25/00*      (2006.01)

(52) U.S. Cl.
CPC .............. *G01R 25/005* (2013.01); *H05B 37/02* (2013.01); *H05B 33/08* (2013.01)
USPC .......................................... 315/308; 315/291

(58) Field of Classification Search
USPC ............. 315/209 R, 224–226, 246, 291, 294, 315/307, 308, 312
See application file for complete search history.

(56) References Cited

U.S. PATENT DOCUMENTS

| 8,653,751 | B2 * | 2/2014 | Shimizu et al. ............... 315/299 |
| 2010/0066266 | A1 | 3/2010 | Huang et al. |
| 2011/0012530 | A1 | 1/2011 | Zheng et al. |
| 2012/0256553 | A1 | 10/2012 | Chen et al. |
| 2013/0154487 | A1 | 6/2013 | Kuang et al. |

OTHER PUBLICATIONS

Search Report issued in corresponding European Patent Application No. 13183875.7 mailed Jul. 3, 2014.

* cited by examiner

*Primary Examiner* — Jimmy Vu
(74) *Attorney, Agent, or Firm* — Banner & Witcoff, Ltd.

(57) ABSTRACT

According to one embodiment, a detection circuit including first and second comparators and a determining unit is provided. The first comparator includes a first input terminal for inputting a first detection voltage, a second input terminal for inputting a first threshold voltage, and a first output terminal configured to output a first output signal. The second comparator includes a third input terminal for inputting a second detection voltage, a fourth input terminal for inputting a second threshold voltage higher than the first threshold voltage, and a second output terminal configured to output a second output signal. The determining unit is configured to determine the presence or absence of conduction angle control of an AC voltage and whether the conduction angle control is a phase control system or an opposite phase control system on the basis of a time difference between the first output signal and the second output signal.

20 Claims, 5 Drawing Sheets

US 8,901,856 B2

DETECTION CIRCUIT, POWER CIRCUIT, AND LUMINAIRE

CROSS-REFERENCE TO RELATED APPLICATIONS

This application is based upon and claims the benefit of priority from Japanese Patent Application No. 2013-057370, filed on Mar. 19, 2013; the entire contents of which are incorporated herein by reference.

FIELD

Embodiments described herein relate generally to a detection circuit, a power circuit, and a luminaire.

BACKGROUND

There is a detection circuit configured to detect presence or absence of a conduction angle control of an AC voltage and the type of the conduction angle control. There is a power circuit including the detection circuit and configure to perform control in accordance with a result of detection by the detection circuit to supply power to a load. The power circuit of this configuration is used in a luminaire provided with a lighting load including illumination light sources such as light-emitting diodes (LEDs), for example. In the detection circuit, it is desired to enable a determination of the presence or absence of the conduction angle control and the type of the conduction angle control with a simpler circuit.

DETAILED DESCRIPTION

Figure 1:
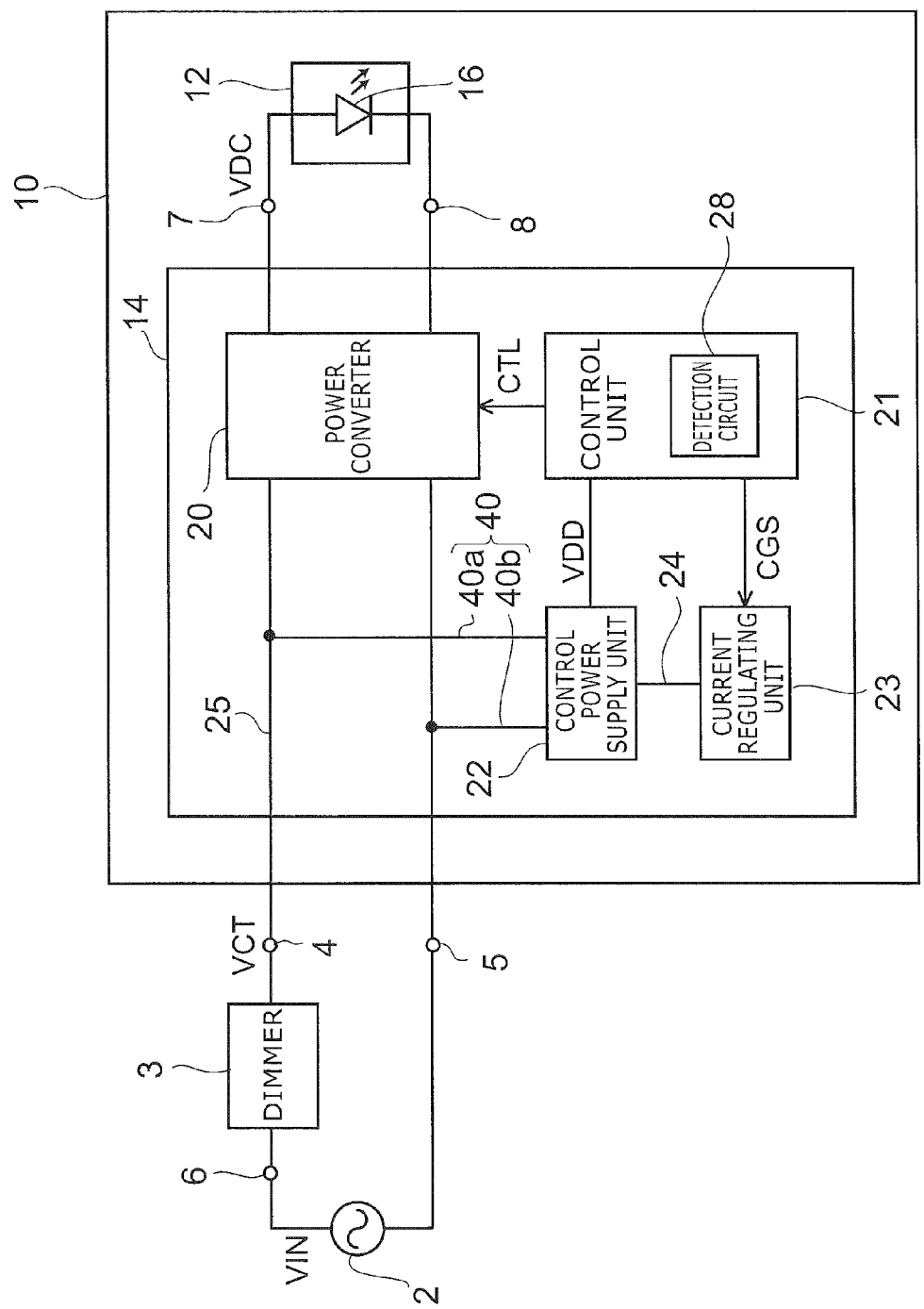
FIG. 1 is a block diagram schematically illustrating a luminaire according to an embodiment.

According to an embodiment, a detection circuit provided with a first comparator, a second comparator, and a determining unit is provided. The first comparator includes a first input terminal for inputting an AC or a pulsed first detection voltage on the basis of an AC voltage, a second input terminal for inputting a first threshold voltage, and a first output terminal configured to output a first output signal having a first state indicating that the first detection voltage is lower than the first threshold voltage and a second state indicating that the first detection voltage is not lower than the first threshold voltage. The second comparator includes a third input terminal for inputting an AC or a pulsed second detection voltage on the basis of the AC voltage, a fourth input terminal for inputting a second threshold voltage, which is higher than the first threshold voltage, and a second output terminal configured to output a second output signal having a third state indicating that the second detection voltage is lower than the second threshold voltage and a fourth state indicating that the second detection voltage is not lower than the second threshold voltage. The determining unit is configured to determine presence or absence of a conduction angle control of the AC voltage and whether the conduction angle control is a phase control system or an opposite phase control system on the basis of a time difference between the first output signal and the second output signal.

According to another embodiment, a power circuit provided with a detection circuit, a power converter, and a control unit is provided. The detection circuit includes a first comparator, a second comparator, and a determining unit. The first comparator includes a first input terminal for inputting an AC or a pulsed first detection voltage on the basis of an AC voltage, a second input terminal for inputting a first threshold voltage, and a first output terminal configured to output a first output signal having a first state indicating that the first detection voltage is lower than the first threshold voltage and a second state indicating that the first detection voltage is not lower than the first threshold voltage. The second comparator includes a third input terminal for inputting an AC or a pulsed second detection voltage on the basis of the AC voltage, a fourth input terminal for inputting a second threshold voltage, which is higher than the first threshold voltage, and a second output terminal configured to output a second output signal having a third state indicating that the second detection voltage is lower than the second threshold voltage and a fourth state indicating that the second detection voltage is not lower than the second threshold voltage. The determining unit is configured to determine presence or absence of a conduction angle control of the AC voltage and whether the conduction angle control is a phase control system or an opposite phase control system on the basis of a time difference between the first output signal and the second output signal. The power converter is configured to convert the AC voltage to a different voltage and supply the voltage after the conversion to a load. The control unit detects a conduction angle of the AC voltage on the basis of the result of the determination by the determining unit and controls the conversion of the voltage by the power converter in accordance with the detected conduction angle.

According to still another embodiment, a luminaire provided with a lighting load and a power circuit is provided. The lighting load includes an illumination light source. The power circuit includes a detection circuit, a power converter, and a control unit. The detection circuit includes a first comparator, a second comparator, and a determining unit. The first comparator includes a first input terminal for inputting an AC or a pulsed first detection voltage on the basis of an AC voltage, a second input terminal for inputting a first threshold voltage, and a first output terminal configured to output a first output signal having a first state indicating that the first detection voltage is lower than the first threshold voltage and a second state indicating that the first detection voltage is not lower than the first threshold voltage. The second comparator includes a third input terminal for inputting an AC or a pulsed second detection voltage on the basis of the AC voltage, a fourth input terminal for inputting a second threshold voltage, which is higher than the first threshold voltage, and a second output terminal configured to output a second output signal having a third state indicating that the second detection voltage is lower than the second threshold voltage and a fourth state indicating that the second detection voltage is not lower than the second threshold voltage. The determining unit is configured to determine presence or absence of a conduction angle control of the AC voltage and whether the conduction angle control is a phase control system or an opposite phase control system on the basis of a time difference between the first output signal and the second output signal. The power converter is configured to convert the AC voltage to a different voltage and supply the voltage after the conversion to a load.

The control unit detects a conduction angle of the AC voltage on the basis of the result of the determination by the determining unit and controls the conversion of the voltage by the power converter in accordance with the detected conduction angle. The power converter is configured to convert the AC voltage to a different voltage and supply the voltage after the conversion to a load. The control unit detects a conduction angle of the AC voltage on the basis of the result of the determination by the determining unit and controls the conversion of the voltage by the power converter in accordance with the detected conduction angle.

Referring now to the drawings, respective embodiments will be described below.

The drawings are schematic or conceptual drawings, and hence relations between the thicknesses and the widths of the respective parts or the ratio between the sizes of the parts are not necessarily the same as reality. Even when illustrating the identical part, the dimensions and the ratios between the parts may be different depending on the drawings.

In the specification and the respective drawings, the same elements as described already in other drawings are designated by the same reference numerals and detailed description will be omitted as needed.

FIG. 1 is a block diagram schematically illustrating a luminaire according to an embodiment.

As illustrated in FIG. 1, a luminaire 10 includes a lighting load 12 (load) and a power circuit 14. The lighting load 12 includes an illumination light source 16 such as a light-emitting diode (LED). The illumination light source 16 may be an organic light-emitting diode (OLED), for example.

The power circuit 14 is connected to an AC power supply 2 and a dimmer 3. In this specification, the term "connect" means electrical connection, and also includes a case where the connection is not established physically and a case where the connection is established via another element.

The AC power supply 2 is, for example, a commercial power supply. The dimmer 3 is configured to generate an AC voltage VCT obtained by controlling a conduction angle of an AC source voltage VIN of the AC power supply 2. The power circuit 14 illuminates the illumination light source 16 by converting the AC voltage VCT supplied from the dimmer 3 to a DC voltage VDC and outputting the same to the lighting load 12. The power circuit 14 performs dimming of the illumination light source 16 synchronously with the conduction-angle-controlled AC voltage VCT. The dimmer 3 is provided as needed, and may be omitted. When the dimmer 3 is not provided, the AC source voltage VIN of the AC power supply 2 is supplied to the power circuit 14.

The conduction angle control of the dimmer 3 includes a phase control (leading edge) system which controls a phase of conduction during a period from a zero cross of the AC voltage to a peak of an absolute value of the AC voltage and an opposite phase control (trailing edge) system which controls a phase of breaking during a period from the peak of the absolute value of the AC voltage to the zero cross of the AC voltage.

The phase-controlling dimmer 3 is simple in circuit configuration, and is capable of handling a relatively high power load. However, in a case where a triac is employed, a light-load action is difficult, and an unstable action may result easily when a so-called power supply dip, which is a temporary drop of the source voltage occurs. The phase-controlling dimmer 3 is characterized by poor incompatibility with a capacitive load because an inrush current is generated when the capacitive load is connected.

In contrast, the opposite-phase-controlling dimmer 3 is capable of acting even with a light load, does not cause the inrush current even when the capacitive load is connected, and is stable in action even when the power supply dip occurs. However, the opposite-phase-controlling dimmer 3 is complex in circuit configuration and is easy to rise in temperature, and hence is not suitable for a heavy load. The opposite-phase-controlling dimmer 3 is characterized by generation of a surge when an inductive load is connected thereto.

In this embodiment, a configuration in which the dimmer 3 is inserted between terminals 4 and 6 of one of a pair of power supply lines configured to supply the source voltage VIN in series is illustrated. However, other configurations are also applicable.

The power circuit 14 includes a power converter 20, a control unit 21, a control power supply unit 22, and a current regulating unit 23. The power converter 20 is configured to convert the AC voltage VCT supplied via a power supply route 25 into the DC voltage VDC having a predetermined voltage value in accordance with the lighting load 12 and supply the same to the lighting load 12.

The control power supply unit 22 includes a wiring part 40 connected to the power supply route 25. The wiring part 40 includes a line 40a connected to the input terminal 4 and a line 40b connected to an input terminal 5. The control power supply unit 22 is configured to convert the AC voltage VCT input via the wiring part 40 into a DC drive voltage VDD in accordance with the control unit 21, and supply the drive voltage VDD to the control unit 21.

The current regulating unit 23 includes a bifurcated route 24 electrically connected to the power supply route 25, and is capable of being switched between a conducting state (first route state) in which part of a current flowing in the power supply route 25 is caused to flow through the bifurcated route 24 and a non-conducting state (second route state) in which no current is flowed therethrough. Accordingly, the current regulating unit 23 regulates the current flowing through the power supply route 25, for example. In this example, the bifurcated route 24 of the current regulating unit 23 is connected to the power supply route 25 via the control power supply unit 22. The bifurcated route 24 may be directly connected to the power supply route 25 without through the intermediary of the control power supply unit 22. The non-conducting state also includes a case where a minute current which does not affect the action flows through the bifurcated route 24. The non-conducting state is a state in which current flowing through the bifurcated route 24 is smaller than that in the conducting state, for example.

The control unit 21 detects a conduction angle of the AC voltage VCT. The control unit 21 generates a control signal CTL corresponding to the detected conduction angle and inputs the control signal CTL to the power converter 20. The power converter 20 generates the DC voltage VDC having a voltage value in accordance with the input control signal CTL. In other words, the control unit 21 controls the conversion to the DC voltage VDC by the power converter 20. The control unit 21 also generates a control signal CGS in accordance with the detected conduction angle, and inputs the control signal CGS to the current regulating unit 23, thereby controlling the switching between the conducting state and the non-conducting state of the current regulating unit 23. In this manner, the control unit 21 dims the illumination light source 16 synchronously with the conduction angle control of the dimmer 3 by controlling the power converter 20 and the current regulating unit 23 in accordance with the detected conduction angle. For example, a microprocessor is employed as the control unit 21.

The control unit 21 is provided with a detection circuit 28. The detection circuit 28 is configured to detect presence or absence of the conduction angle control of the AC voltage VCT and the type of the conduction angle control. The detection circuit 28 is configured to detect whether the conduction angle control of the AC voltage VCT is the phase control or the opposite phase control. In other words, the detection circuit 28 detects whether the dimmer 3 is connected or not. When connected, the detection circuit 28 detects whether the dimmer 3 is a dimmer which performs the phase control or a dimmer which performs the opposite phase control. Detection of the conduction angle of the AC voltage VCT is performed on the basis of, for example, the result of detection by the detection circuit 28. The control unit 21 is configured to control the power converter 20 and the current regulating unit 23 in accordance with the presence or absence of the conduction angle control and the type thereof detected by the detection circuit 28.

Figure 2:
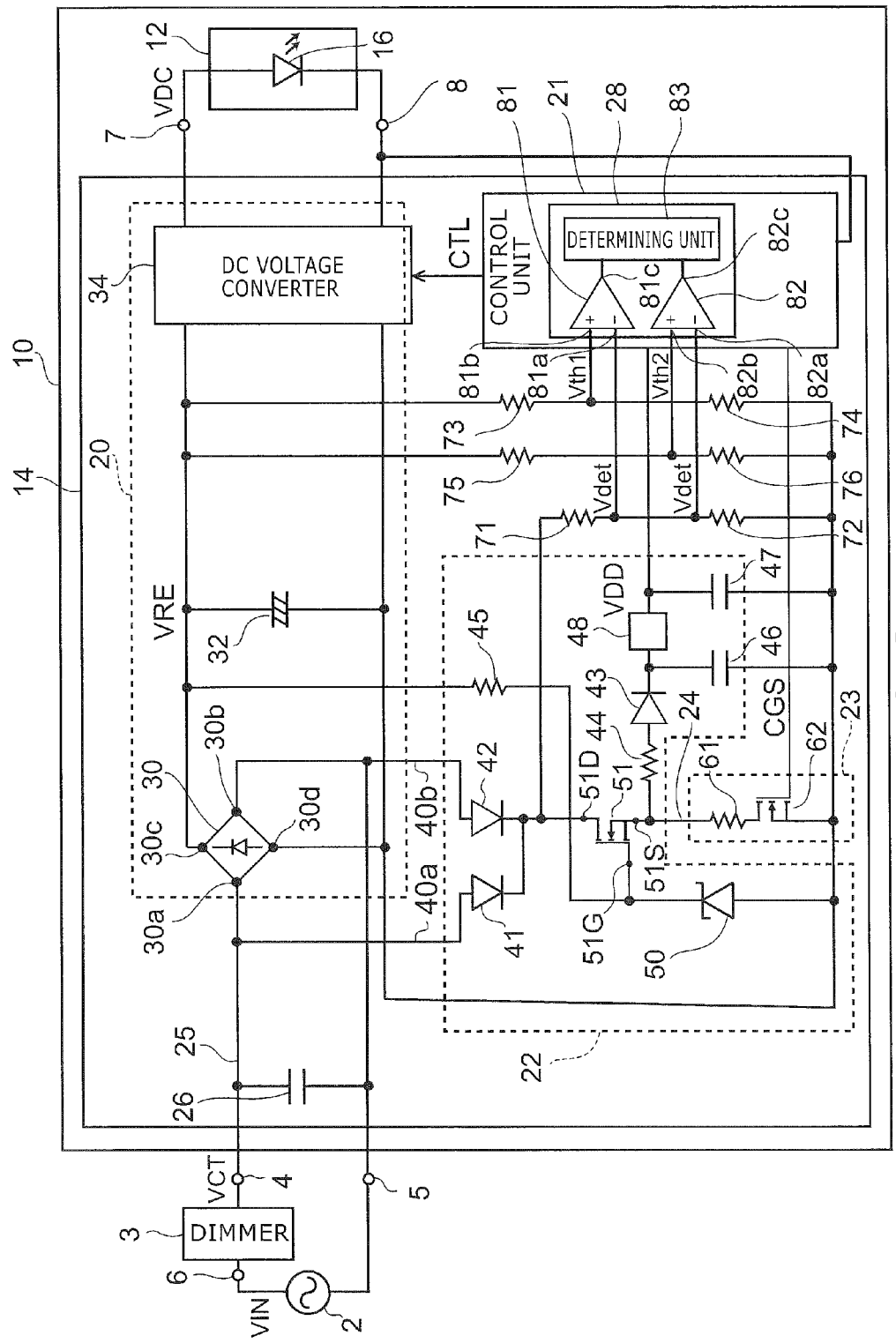
FIG. 2 is a circuit diagram schematically illustrating a power circuit according to the embodiment.

FIG. 2 is a circuit diagram schematically illustrating a power circuit according to the embodiment.

As illustrated in FIG. 2, the power converter 20 includes a rectifying circuit 30, a smoothing capacitor 32, and a DC voltage converter 34.

The rectifying circuit 30 is configured with a diode bride, for example. Input terminals 30a and 30b of the rectifying circuit 30 are connected to the pair of input terminals 4 and 5. The phase-controlled or opposite-phase-controlled AC voltage VCT is input to the input terminals 30a and 30b of the rectifying circuit 30 via the dimmer 3. The rectifying circuit 30 is configured to perform, for example, full-wave rectification of the AC voltage VCT to generate a pulsed voltage after the full-wave rectification between a high-potential terminal 30c and a low-potential terminal 30d.

The smoothing capacitor 32 is connected between the high-potential terminal 30c and the low-potential terminal 30d of the rectifying circuit 30. The smoothing capacitor 32 smoothens the pulsed voltage rectified by the rectifying circuit 30. Accordingly, a DC voltage VRE (a first DC voltage) appears at both ends of the smoothing capacitor 32.

The DC voltage converter 34 is connected to the both ends of the smoothing capacitor 32. Accordingly, the DC voltage VRE is input to the DC voltage converter 34. The DC voltage converter 34 is configured to convert the DC voltage VRE into the DC voltage VDC (second DC voltage) having a different voltage value, and output the DC voltage VDC to output terminals 7 and 8 of the power circuit 14. The lighting load 12 is connected to the output terminals 7 and 8. The lighting load 12 illuminates the illumination light source 16 by the DC voltage VDC supplied from the power circuit 14.

The DC voltage converter 34 is connected to the control unit 21. The control unit 21 is configured to input the control signal CTL to the DC voltage converter 34. The DC voltage converter 34 is configured to lower the DC voltage VRE in accordance with, for example, the control signal CTL. Accordingly, for example, the DC voltage converter 34 converts the DC voltage VRE to the DC voltage VDC corresponding to the specification of the lighting load 12 or the dimming degree of the dimmer 3.

The DC voltage converter 34 includes, for example, a switching element such as an FET, and is configured to lower the DC voltage VRE by turning ON and OFF the switching element. The control unit 21, for example, inputs a duty signal specifying the timing of ON and OFF of the switching element to the DC voltage converter 34 as the control signal CTL. Accordingly, the voltage value of the DC voltage VDC may be adjusted to a value in accordance with a duty ratio of the control signal CTL. The DC voltage converter 34 is, for example, a step-down type DC-DC converter.

The power circuit 14 further includes a filter capacitor 26. The filter capacitor 26 is connected between the input terminals 4 and 5. In other words, the filter capacitor 26 is connected to the power supply route 25. The filter capacitor 26 is configured to remove a noise included in the AC voltage VCT, for example.

The control power supply unit 22 includes rectifying elements 41 to 43, resistances 44 and 45, capacitors 46 and 47, a regulator 48, a Zener Diode 50, and a semiconductor element 51.

The rectifying elements 41 and 42 are, for example, diodes. An anode of the rectifying element 41 is connected to one input terminal 30a of the rectifying circuit 30 via the line 40a. An anode of the rectifying element 42 is connected to the other input terminal 30b of the rectifying circuit 30 via the line 40b.

An FET or a GaN-HEMT is used as the semiconductor element 51. In the following description, the semiconductor element 51 is assumed to be the FET. In this example, the semiconductor element 51 is an n-channel FET of an enhancement type. The semiconductor element 51 includes a source electrode 51S, a drain electrode 51D, and a gate electrode 51G. The potential of the drain electrode 51D is set to be higher than the potential of the source electrode 51S. The gate electrode 51G is used for switching between a first state in which a current flows between the source electrode 51S and the drain electrode 51D and a second state in which the current flowing between the source electrode 51S and the drain electrode 51D is smaller than in the first state. In the second state, a current does not substantially flow between the source electrode 51S and the drain electrode 51D. The semiconductor element 51 may either be a p-channel type and a depression type. For example, when the semiconductor element 51 of the p-channel type is employed, the drain electrode 51D corresponds to a first main electrode, and the source electrode 51S corresponds to a second main electrode. In other words, in the case of the p-channel type, the potential of the source electrode 51S is set to be higher than the potential of the drain electrode 51D.

The drain electrode 51D of the semiconductor element 51 is connected to a cathode of the rectifying element 41 and a cathode of the rectifying element 42. In other words, the drain electrode 51D of the semiconductor element 51 is connected to the power supply route 25 via the rectifying elements 41 and 42. The source electrode 51S of the semiconductor element 51 is connected to one end of the resistance 44. The gate electrode 51G of the semiconductor element 51 is connected to a cathode of the Zener Diode 50. The gate electrode 51G of the semiconductor element 51 is connected to the high-potential terminal 30c, which is an output terminal of the rectifying circuit 30 on the high-potential side via the resistance 45.

The other end of the resistance 44 is connected to an anode of the rectifying element 43. A cathode of the rectifying element 43 is connected to one end of the capacitor 46 and one end of the regulator 48. The other end of the regulator 48 is connected to the control unit 21 and one end of the capacitor 47.

A current of one polarity in association with application of the AC voltage VCT flows to the drain electrode 51D of the semiconductor element 51 via the rectifying element 41. In contrast, a current of the other polarity in association with application of the AC voltage VCT flows to the drain electrode 51D of the semiconductor element 51 via the rectifying element 42. Accordingly, a pulsed voltage obtained by performing full-wave rectification on the AC voltage VCT is applied to the drain electrode 51D of the semiconductor element 51.

The DC voltage VRE smoothened by the smoothing capacitor 32 is applied to the cathode of the Zener Diode 50 via the resistance 45. Accordingly, a substantially constant voltage according to a breakdown voltage of the Zener Diode 50 is applied to the gate electrode 51G of the semiconductor element 51. In association with this, a substantially constant current flows between the drain and the source of the semiconductor element 51. In this manner, the semiconductor element 51 functions as a constant current element. The semiconductor element 51 regulates a current flowing in the wiring part 40.

The capacitor 46 is configured to smoothen a pulsed voltage supplied from the source electrode 51S of the semiconductor element 51 via the resistance 44 and the rectifying element 43 and convert the pulsed voltage to a DC voltage. The regulator 48 is configured to generate the substantially constant DC drive voltage VDD from the input DC voltage, and output the same to the control unit 21. The capacitor 47 is used, for example, to remove a noise of the drive voltage VDD. Accordingly, the drive voltage VDD is supplied to the control unit 21.

At this time, as described above, the drain electrode 51D of the semiconductor element 51 is connected to the power supply route 25, and the gate electrode 51G of the semiconductor element 51 is connected to the high-potential terminal 30c of the rectifying circuit 30. In other words, the AC voltage VCT is applied to the drain electrode 51D of the semiconductor element 51, and the DC voltage VRE is applied to the gate electrode 51G of the semiconductor element 51. Accordingly, for example, the action of the semiconductor element 51 may be stabilized. Loads applied to the rectifying elements 41 and 42 may be suppressed. The stabilized drive voltage VDD may be supplied to the control unit 21. As a result, the action of the control unit 21 may be stabilized. The voltage applied o the drain electrode 51D of the semiconductor element 51 may only be a voltage not smoothened by the smoothing capacitor 32. For example, a pulsed voltage after the rectification by the rectifying circuit 30 is also applicable. The voltage to be applied to the gate electrode 51G of the semiconductor element 51 may only be a voltage smoothened by the smoothing capacitor 32. For example, the DC voltage VDC is also applicable.

The current regulating unit 23 includes a resistance 61 and a switching element 62. An FET or a GaN-HEMT, for example, is used as the switching element 62. In the following description, the switching element 62 is assumed to be the FET.

One end of the resistance 61 is connected to the source electrode 51S of the semiconductor element 51. The other end of the resistance 61 is connected to a drain of the switching element 62. A gate of the switching element 62 is connected to the control unit 21. The control unit 21 is configured to input the control signal CGS to the gate of the switching element 62. A normally-off type, for example, is used as the switching element 62. For example, the switching element 62 is changed from the OFF state to the ON state by switching the control signal CGS input from the control unit 21 from Lo to Hi.

When the switching element 62 is brought into the ON state, part of the current flowing in the power supply route 25 flows to the bifurcated route 24, for example, via the rectifying elements 41 and 42 and the semiconductor element 51. In other words, the current regulating unit 23 is brought into a conducting state by bringing the switching element 62 into the ON state, and the current regulating unit 23 is brought into a non-conducting state by bringing the switching element 62 into the OFF state.

A source of the switching element 62, an anode of the Zener Diode 50, the other end of the capacitor 46, and the other end of the capacitor 47 are connected to the low-potential terminal 30d of the rectifying circuit 30. In other words, a ground of the control power supply unit 22 and a ground of the current regulating unit 23 are shared with a ground of the DC voltage converter 34 on the input side. In contrast, a ground of the control unit 21 is connected to the output terminal 8. In other words, the ground of the control unit 21 is shared with a ground of the DC voltage converter 34 on the output side. Accordingly, the action of the control unit 21, for example, is further stabilized.

The power circuit 14 is further provided with resistances 71 to 76. One end of the resistance 71 is connected to the drain electrode 51D of the semiconductor element 51. The other end of the resistance 71 is connected to one end of the resistance 72. The other end of the resistance 72 is connected to the low-potential terminal 30d of the rectifying circuit 30.

One end of the resistance 73 is connected to the high-potential terminal 30c of the rectifying circuit 30. The other end of the resistance 73 is connected to one end of the resistance 74. The other end of the resistance 74 is connected to the low-potential terminal 30d of the rectifying circuit 30.

One end of the resistance 75 is connected to the high-potential terminal 30c of the rectifying circuit 30. The other end of the resistance 75 is connected to one end of the resistance 76. The other end of the resistance 76 is connected to the low-potential terminal 30d of the rectifying circuit 30.

The detection circuit 28 is provided with a first comparator 81, a second comparator 82, and a determining unit 83. The first comparator 81 includes a first input terminal 81a, a second input terminal 81b, and a first output terminal 81c. The second comparator 82 includes a third input terminal 82a, a fourth input terminal 82b, and a second output terminal 82c.

The first input terminal 81a of the first comparator 81 is connected to a connecting point between the resistance 71 and the resistance 72. Accordingly, a pulsed voltage in accordance with a voltage dividing ratio between the resistances 71 and 72 is input to the first input terminal 81a of the first comparator 81 as a first detection voltage for detecting the presence or absence of the conduction angle control and the type thereof. The first detection voltage may be an AC voltage before rectification, for example. In this manner, the first input terminal 81a is a terminal for inputting the AC or pulsed first detection voltage on the basis of the AC source voltage VIN or the AC voltage VCT.

The second input terminal 81b of the first comparator 81 is connected to a connecting point between the resistance 73 and the resistance 74. Accordingly, a DC voltage in accordance with a voltage dividing ratio between the resistances 73 and 74 is input to the second input terminal 81b of the first comparator 81 as a first threshold voltage Vth1. A voltage value of the first threshold voltage Vth1 is lower than a maximum value of the first detection voltage. For example, the voltage dividing ratio between the resistances 73 and 74 is set so that the voltage value of the first threshold voltage Vth1 is lower than the maximum value of the first detection voltage. In this manner, the second input terminal 81b is a terminal for inputting the first threshold voltage Vth1.

The first output terminal 81c of the first comparator 81 outputs a first output signal. The first output signal includes a first state indicating that the first detection voltage is lower than the first threshold voltage Vth1 and a second state indicating that the first detection voltage is not lower than the first threshold voltage Vth1. In this example, the first input terminal 81a is an inverting input terminal and the second input terminal 81b is a non-inverting input terminal. Therefore, in the first output signal of this example, the state becomes Hi (first state) when the first detection voltage is lower than the first threshold voltage Vth1 and becomes Lo (second state) when the first detection voltage is not lower than the first threshold voltage Vth1.

In contrast, a configuration in which the first input terminal 81a is the non-inverting input terminal and the second input terminal 81b is the inverting input terminal is also applicable. In this case, the first output signal becomes Lo (first state) when the first detection voltage is lower than the first threshold voltage Vth1 and the first output signal becomes Hi (second state) when the first detection voltage is not lower than the first threshold voltage Vth1.

The third input terminal 82a of the second comparator 82 is connected to the connecting point between the resistance 71 and the resistance 72. Accordingly, a pulsed voltage in accordance with the voltage dividing ratio between the resistances 71 and 72 is input to the third input terminal 82a of the second comparator 82 as a second detection voltage for detecting the presence or absence of the conduction angle control and the type thereof. The second detection voltage may be an AC voltage before rectification, for example. The third input terminal 82a is a terminal for inputting the AC or pulsed second detection voltage on the basis of the AC source voltage VIN or the AC voltage VCT. In this example, the second detection voltage is substantially the same as the first detection voltage. The second detection voltage may be a voltage different from the first detection voltage.

The fourth input terminal 82b of the second comparator 82 is connected to a connecting point between the resistance 75 and the resistance 76. Accordingly, a DC voltage in accordance with a voltage dividing ratio between the resistances 75 and 76 is input to the fourth input terminal 82b of the second comparator 82 as a second threshold voltage Vth2. A voltage value of the second threshold voltage Vth2 is lower than a maximum value of the second detection voltage. The second threshold voltage Vth2 is higher than the first threshold voltage Vth1. For example, an absolute value of the second threshold voltage Vth2 is higher than an absolute value of the first threshold voltage Vth1. For example, the voltage dividing ratio between the resistances 75 and 76 is set so that the second threshold voltage Vth2 becomes lower than a maximum value of a detection voltage Vdet and higher than the first threshold voltage Vth1. In this manner, the fourth input terminal 82b is a terminal for inputting the second threshold voltage Vth2.

The second output terminal 82c of the second comparator 82 outputs a second output signal. The second output signal includes a third state indicating that the second detection voltage is lower than the second threshold voltage Vth2 and a fourth state indicating that the second detection voltage is not lower than the second threshold voltage Vth2. In this example, the third input terminal 82a is the inverting input terminal and the fourth input terminal 82b is the non-inverting input terminal. Therefore, in the second output signal of this example, the state becomes Hi (third state) when the second detection voltage is lower than the second threshold voltage Vth2 and becomes Lo (fourth state) when the second detection voltage is not lower than the second threshold voltage Vth2.

In contrast, a configuration in which the third input terminal 82a is the non-inverting input terminal and the fourth input terminal 82b is the inverting input terminal is also applicable. In this case, the second output signal becomes Lo (third state) when the second detection voltage is lower than the second threshold voltage Vth2 and the second output signal becomes Hi (fourth state) when the second detection voltage is not lower than the second threshold voltage Vth2.

The polarities of the second output signals of Hi and Lo of the second comparator 82 may be opposite to the polarity of the first output signal of the first comparator 81. For example, the first output signal of the first comparator 81 is set to Lo when the first detection voltage is not lower than the first threshold voltage Vth1, and the second output signal of the second comparator 82 may be set to Hi when the second detection voltage is not lower than the second threshold voltage Vth2. The first threshold voltage Vth1 is, for example, on the order of 1V. The second threshold voltage Vth2 is, for example, on the order of 3V. In the following description, the first detection voltage and the second detection voltage are collectively referred to as the "detection voltage Vdet".

The determining unit 83 is connected to the first output terminal 81c from the first comparator 81 and the second output terminal 82c from the second comparator 82, respectively. The determining unit 83 determines the presence or absence of the conduction angle control and the type thereof on the basis of the first output signal of the first comparator 81 and the second output signal of the second comparator 82. The determining unit 83 performs determination on the basis of a time difference between the first output signal and the second output signal, for example.

FIGS. 3A to 3D are graph schematically illustrating an action of the control unit according to the embodiment.

FIGS. 3A to 3D illustrate examples of the action of the control unit 21 in a case where the conduction angle control of the AC voltage input to the power circuit 14 is not performed. The case where the conduction angle control is not performed is, for example, a case where the dimmer 3 is not connected and the source voltage VIN of the AC power supply 2 is input to the power circuit 14. When the conduction angle control is not performed, for example, a case where the dimming degree of the dimmer 3 is extremely small is conceivable. The case where the conduction angle control is not performed is, for example, a state in which the AC voltage of a substantially sinusoidal wave is input to the power circuit 14. The control unit 21 is activated in accordance with a supply of the drive voltage VDD from the control power supply unit 22, and then causes the determining unit 83 of the detection circuit 28 to determine the presence or absence of the conduction angle control and the type thereof.

Lateral axes of FIGS. 3A to 3D indicate a time t.

Figure 3A:
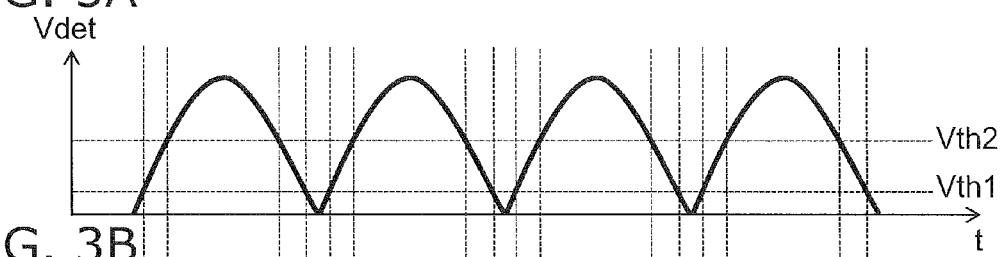
FIGS. 3A to 3D are graphs schematically illustrating an action of a control unit according to the embodiment.

A vertical axis of FIG. 3A indicates the detection voltage Vdet.

Figure 3B:
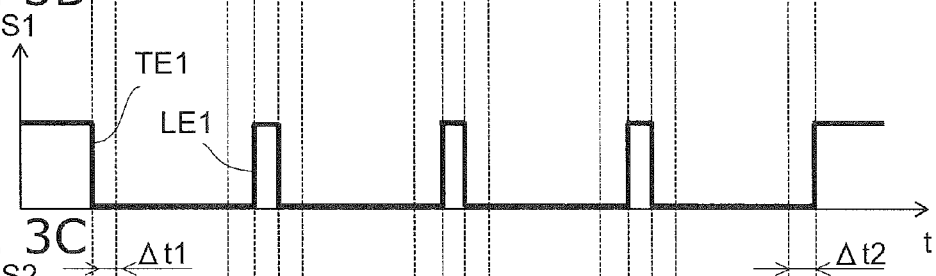

A vertical axis of FIG. 3B indicates a first output signal S1 of the first comparator 81.

Figure 3C:
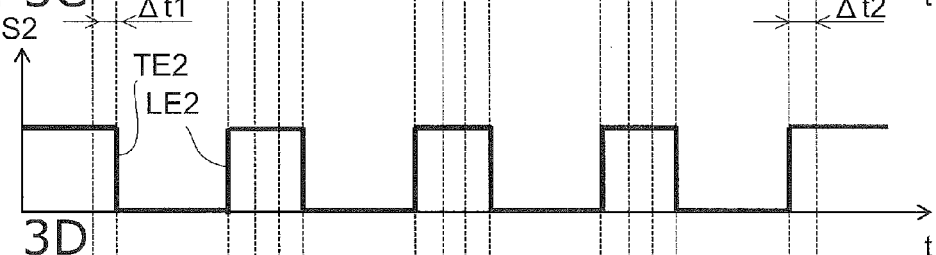

A vertical axis of FIG. 3C indicates a second output signal S2 of the second comparator 82.

Figure 3D:
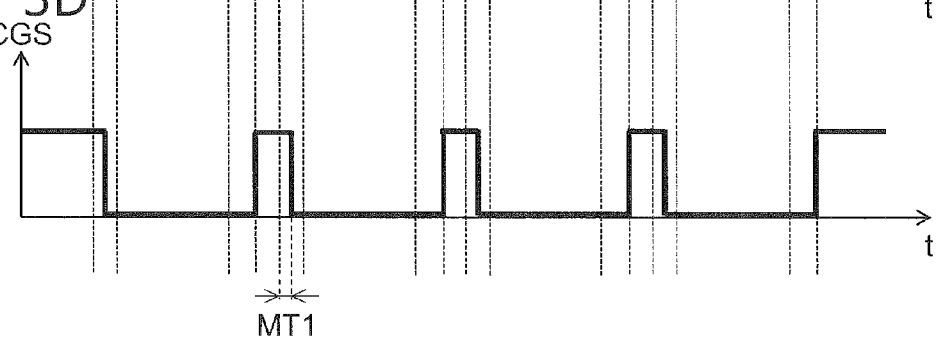
Figure 4A:
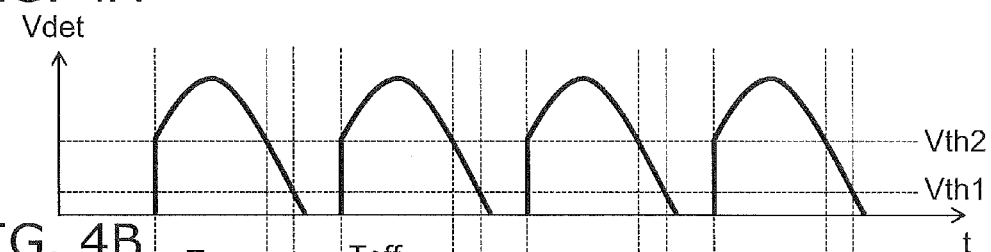
FIGS. 4A to 4D are graphs schematically illustrating an action of the control unit according to the embodiment.
Figure 4B:
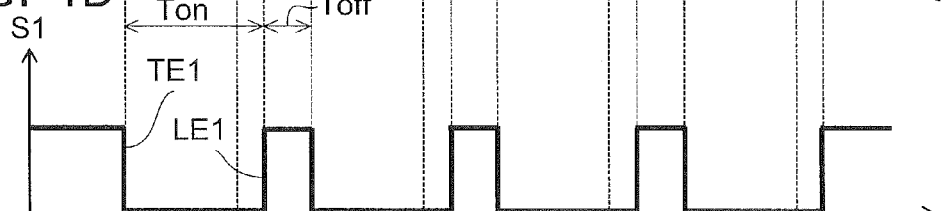
Figure 4C:
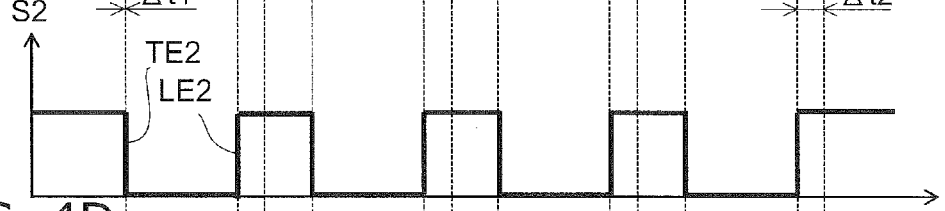
Figure 4D:
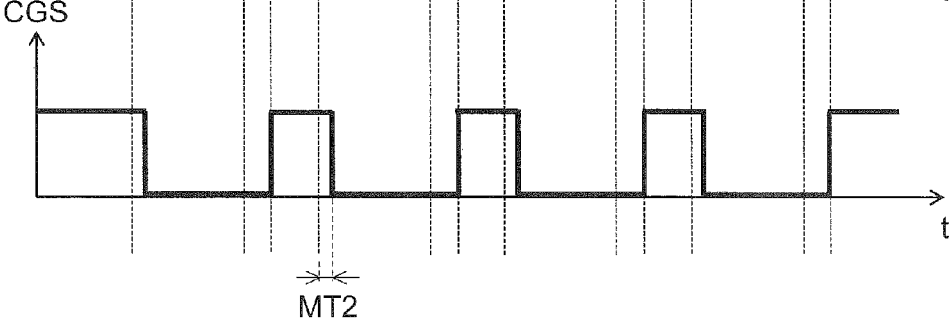
Figure 5A:
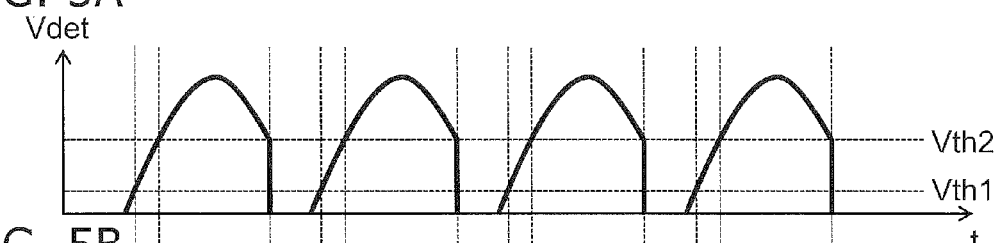
FIGS. 5A to 5D are graphs schematically illustrating an action of the control unit according to the embodiment.
Figure 5B:
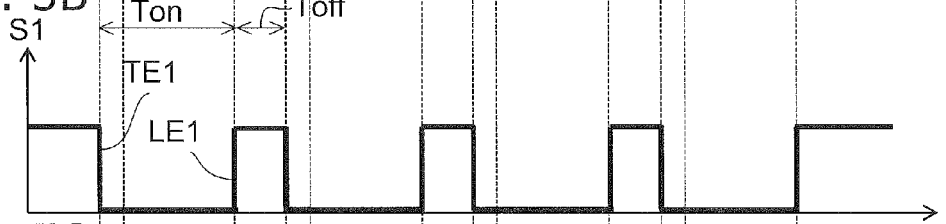
Figure 5C:
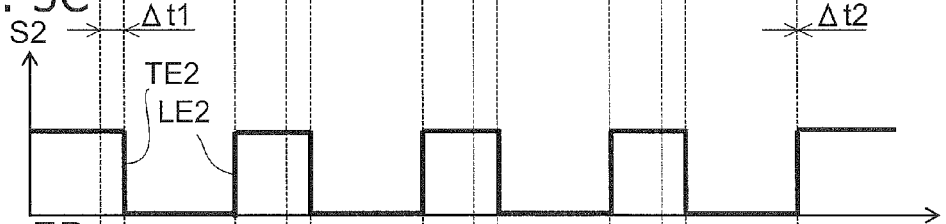
Figure 5D:
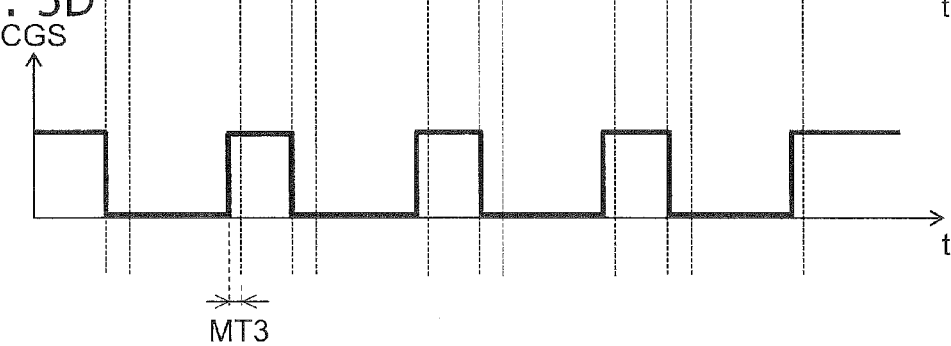

A vertical axis of FIG. 3D indicates a voltage value of the control signal CGS.

The determining unit 83 determines the presence or absence of the conduction angle control and the type thereof on the basis of the first output signal S1, the second output signal S2, and a time difference among the output signals S1 and S2. More specifically, the determining unit 83 determines the presence or absence of the conduction angle control and the type thereof on the basis of a lowering edge TE1 of the first output signal S1, a rising edge LE1 of the first output signal S1, a lowering edge TE2 of the second output signal S2, a rising edge LE2 of the second output signal S2, and the time difference between the respective edges.

In this example, the first output signal S1 becomes Lo when the detection voltage Vdet is not lower than the first threshold voltage Vth1. When the detection voltage Vdet is not lower than the second threshold voltage Vth2, the second output signal S2 becomes Lo.

In this case, in a portion of a half wave of the AC voltage, the respective edges change in the order of the lowering edge TE1 of the first output signal S1, the lowering edge TE2 of the second output signal S2, the rising edge LE2 of the second output signal S2, and the rising edge LE1 of the first output signal S1. Therefore, the determining unit 83 determines a portion between the lowering edge TE1 of the first output signal S1 and the rising edge LE1 of the first output signal S1 to be the portion of the half wave of the AC voltage.

In other words, in this example, the lowering edge TE1 of the first output signal S1 corresponds to a first switching point where the first output signal S1 is switched from the first state to the second state. The lowering edge TE2 of the second output signal S2 corresponds to a second switching point where the second output signal S2 is switched from the third state to the fourth state. The rising edge LE2 of the second output signal S2 corresponds to a third switching point where the second output signal S2 is switched from the fourth state to the third state. The rising edge LE1 of the first output signal S1 corresponds to a fourth switching point where the first output signal S1 switches from the second state to the first state.

The determining unit 83 counts a first time difference $\Delta t1$ between the lowering edge TE1 of the first output signal S1 and the lowering edge TE2 of the second output signal S2. The determining unit 83 also counts a second time difference $\Delta t2$ between the rising edge LE2 of the second output signal S2 and the rising edge LE1 of the first output signal S1. Counting of the respective time differences $\Delta t1$ and $\Delta t2$ by the determining unit 83 may be performed, for example, by using an internal clock of the control unit 21 or may be performed by providing a timer externally of the control unit 21.

As illustrated in FIGS. 3A to 3D, in the case that the conduction angle control is not performed, a predetermined time difference is generated between the lowering edge TE1 of the first output signal S1 and the lowering edge TE2 of the second output signal S2 and between the rising edge LE2 of the second output signal S2 and the rising edge LE1 of the first output signal S1. Therefore, the determining unit 83 counts the first time difference $\Delta t1$ and the second time difference $\Delta t2$ and determines that the conduction angle control is not performed when the respective time differences $\Delta t1$ and $\Delta t2$ are not lower than a predetermined value. The determining unit 83 determines that the conduction angle control is not performed when the respective time differences $\Delta t1$ and $\Delta t2$ are not smaller than 0.5 msec, for example.

The determining unit 83 performs the determination regularly, for example, until input of the source voltage VIN or the AC voltage VCT is stopped. The determination by the determining unit 83 may be performed at every half wave of the source voltage VIN or the AC voltage VCT, for example, or may be performed at every predetermined number of half waves.

When the determining unit 83 determines that the conduction angle control is not performed, the control unit 21 generates the control signal CTL having a duty ratio corresponding to the case where the conduction angle control is not performed, and inputs the generated control signal CTL to the DC voltage converter 34. Accordingly, the illumination light source 16 illuminates at brightness in accordance with the source voltage VIN.

The control unit 21 sets the control signal CGS to Hi (the current regulating unit 23 is set to the conducting state) when the voltage value of the detection voltage Vdet is lower than the first threshold voltage Vth1. The control unit 21 sets the control signal CGS to Lo (the current regulating unit 23 is set to the non-conducting state) when the voltage value of the detection voltage Vdet is not lower than the first threshold voltage Vth1. In other words, the control unit 21 brings the current regulating unit 23 into the conducting state when the source voltage VIN or the AC voltage VCT is lower than a lower limit value, and brings the current regulating unit 23 into the non-conducting state when the source voltage VIN or the AC voltage VCT is not lower than the lower limit value.

The control unit 21 sets the timing to switch the current regulating unit 23 from the conducting state to the non-conducting state to be a first minute time MT1 later than the timing at which the voltage value of the detection voltage Vdet is switched from the state of lower than the first threshold voltage Vth1 to the state of not lower than the first threshold voltage Vth1 when the determining unit 83 determines that the conduction angle control is not performed.

For example, it is assumed that the conduction angle control is determined not to be performed in a state in which the triac is employed as the dimmer 3 configured to perform the conduction angle control in the phase control system and an LED is used as the illumination light source 16. The consumed current of the LED is lower than the consumed current of a filament lamp. Therefore, when the action as described above is not performed, a holding current required for turning the triac ON cannot be flowed in the state in which the AC voltage VCT is not higher than the predetermined value, so that the action of the dimmer 3 may be unstable.

In contrast, in the power circuit 14 of the embodiment, the holding current required for turning the triac ON can be flowed to the current regulating unit 23 (the bifurcated route 24) at the AC voltage VCT not higher than the predetermined value by controlling the action of the current regulating unit 23 as described above. Accordingly, the action of the dimmer 3 may be stabilized. Also, by setting the timing of switching of the current regulating unit 23 to be the first minute time MT1 later, the action of the dimmer 3 may further be stabilized.

In this example, the first threshold voltage Vth1 is used for determining the timing of switching the control signal CGS. In other words, in this example, the first threshold voltage Vth1 is used as the lower limit value. The lower limit value may be a voltage having a value different from the first threshold voltage Vth1. For example, a comparator for determining the timing of switching the control signal CGS may be provided separately.

FIGS. 4A to 4D are graphs schematically illustrating actions of the control unit according to the embodiment.

FIGS. 4A to 4D illustrate examples of the action of the control unit 21 in a case where the conduction angle of the AC voltage input to the power circuit 14 is controlled in the phase control system. The respective lateral axes and the vertical axes in FIG. 4A to FIG. 4D are the same as the respective lateral axes and the vertical axes in FIGS. 3A to 3D.

As illustrated in FIGS. 4A to 4D, in the case of the conduction angle control of the phase control system, the first time difference $\Delta t1$ between the lowering edge TE1 of the first output signal S1 and the lowering edge TE2 of the second output signal S2 becomes extremely small. For example, the first time difference $\Delta t1$ becomes smaller than 0.5 msec. Therefore, the determining unit 83 counts the first time difference $\Delta t1$ and the second time difference $\Delta t2$ and determines that the conduction angle control of the phase control system is performed when the first time difference Δt1 is smaller than the predetermined value and the second time difference Δt2 is not lower than the predetermined value. The determining unit 83 determines that the conduction angle control of the phase control system is performed when the first time difference Δt1 is smaller than 0.5 msec and the second time difference Δt2 is not smaller than 0.5 msec, for example.

The control unit 21 detects the conduction angle of the AC voltage VCT on the basis of the result of determination by the determining unit 83 when the conduction angle control of the phase control system is determined by the determining unit 83. The control unit 21 determines, for example, that a segment in which the first output signal S1 is set to Lo is a conducting segment Ton of the conduction angle control of the dimmer 3. The control unit 21 determines that a segment in which the first output signal S1 is set to Hi is a breaking segment Toff of the conduction angle control of the dimmer 3. Accordingly, the control unit 21 detects the conduction angle of the AC voltage VCT from a ratio between the conducting segment Ton and the breaking segment Toff. Detection of the conducting angle may be performed on the basis of the second output signal S2. The detection of the conduction angle may be performed on the basis of a threshold value different from the first threshold voltage Vth1 and the second threshold voltage Vth2.

The control unit 21 detects the conduction angle of the AC voltage VCT, generates the control signal CTL of a duty ratio corresponding to the conduction angle, and inputs the generated control signal CTL to the DC voltage converter 34. Accordingly, the illumination light source 16 is dimmed in accordance with the AC voltage VCT which is controlled in conduction angle in the phase control system.

In the same manner as the case where the conduction angle control is not performed, the control unit 21 sets the control signal CGS to Hi when the voltage value of the detection voltage Vdet is lower than the first threshold voltage Vth1. The control unit 21 sets the control signal CGS to Lo when the voltage value of the detection voltage Vdet is not lower than the first threshold voltage Vth1. The control unit 21 sets the timing to switch the current regulating unit 23 from the conducting state to the non-conducting state to be a second minute time MT2 later than the timing at which the voltage value of the detection voltage Vdet is switched from the state of lower than the first threshold voltage Vth1 to the state of not lower than the first threshold voltage Vth1 when the conduction angle control of the phase control system is determined by the determining unit 83.

Accordingly, in the case where the conduction angle control of the phase control system is performed, the action of the dimmer 3 may be stabilized. The second minute time MT2 is substantially the same, for example, as the first minute time MT1. The second minute time MT2 may be different from the first minute time MT1.

FIGS. 5A to 5D are graphs schematically illustrating the actions of the control unit of the embodiment.

FIGS. 5A to 5D illustrate examples of the action of the control unit 21 in a case where the conduction angle of the AC voltage input to the power circuit 14 is controlled in the opposite phase control system. The respective lateral axes and the vertical axes in FIGS. 5A to 5D are the same as the respective lateral axes and the vertical axes in FIGS. 3A to 3D and FIGS. 4A to 4D.

As illustrated in FIGS. 5A to 5D, in the case of the conduction angle control of the opposite phase control system, the second time difference Δt2 between the rising edge LE2 of the second output signal S2 and the rising edge LE1 of the first output signal S1 becomes extremely small. For example, the second time difference Δt2 becomes smaller than 0.5 msec. Therefore, the determining unit 83 counts the first time difference Δt1 and the second time difference Δt2 and determines that the conduction angle control of the opposite phase control system is performed when the time difference Δt1 is not smaller than the predetermined value and the second time difference Δt2 is smaller than the predetermined value. The determining unit 83 determines that the conduction angle control of the opposite phase control system is performed when the first time difference Δt1 is not smaller than 0.5 msec and the second time difference Δt2 is smaller than 0.5 msec, for example.

The control unit 21 detects the conduction angle of the AC voltage VCT when the conduction angle control of the opposite phase control system is determined by the determining unit 83. The control unit 21 determines, for example, that the segment in which the first output signal S1 is set to Lo is the conducting segment Ton of the conduction angle control of the dimmer 3. The control unit 21 determines that the segment in which the first output signal S1 is set to Hi is the breaking segment Toff of the conduction angle control of the dimmer 3. Accordingly, the control unit 21 detects the conducting angle of the AC voltage VCT from the ratio between the conducting segment Ton and the breaking segment Toff.

The control unit 21 detects the conduction angle of the AC voltage VCT, generates the control signal CTL of the duty ratio corresponding to the conduction angle, and inputs the generated control signal CTL to the DC voltage converter 34. Accordingly, the illumination light source 16 may be dimmed in accordance with the AC voltage VCT which is controlled in conduction angle also in the opposite phase control system.

The control unit 21 sets the control signal CGS to Hi when the voltage value of the detection voltage Vdet is lower than the first threshold voltage Vth1. The control unit 21 sets the control signal CGS to Lo when the voltage value of the detection voltage Vdet is not lower than the first threshold voltage Vth1.

The control unit 21 sets the timing to switch the current regulating unit 23 from the non-conducting state to the conducting state to be a third minute time MT3 earlier than the timing at which the voltage value of the detection voltage Vdet is switched from the state of not lower than the first threshold voltage Vth1 to the state of lower than the first threshold voltage Vth1 when the conduction angle control of the opposite phase control system is determined by the determining unit 83.

The control unit 21 memorizes, for example, a time of the conducting segment Ton of the half wave detected previously, and switches the current regulating unit 23 from the non-conducting state to the conducting state at a timing the third minute time MT3 earlier than the time of the conducting segment Ton.

In the opposite phase control system, there may be a case where the conducting segment Ton becomes longer than an actual conducting segment of the dimmer 3 under the influence of a charge accumulated in the filter capacitor 26 or the like. When the conducting segment Ton becomes longer than the actual conducting segment, for example, the duty ratio of the control signal CTL changes and the dimming degree of the illumination light source 16 changes.

By causing part of the current flowing through the power supply route 25 to flow in the bifurcated route 24 by bringing the current regulating unit 23 into the conducting state, the charge accumulated in the filter capacitor 26 or the like may be taken out to the current regulating unit 23. Accordingly, the power circuit 14 may detect the conduction angle of the opposite-phase-controlled AC voltage VCT further reliably. The illumination light source 16 may be dimmed with higher degree of accuracy. As described above, by setting the timing to switch the current regulating unit 23 earlier by the third minute time MT3, the charge accumulated in the filter capacitor 26 or the like may be taken out further adequately. The detection accuracy of the conduction angle may further be enhanced.

For example, there is a detection circuit configured to detect the edge having an input voltage waveform by an A/D converter or the like and detect the presence or absence of the conduction angle control and the type thereof on the basis of the gradient of the voltage or the like. However, in such a detection circuit, the circuit becomes complicated such that a memory is required. For example, a certain degree of performance is required for the microcomputer.

In contrast, the detection circuit 28 according to the embodiment may determine the presence or absence of the conduction angle control and the type thereof on the basis of the respective output signals S1 and S2 of the first comparator 81 and the second comparator 82. In the detection circuit 28, for example, the memory is not required. In this manner, the detection circuit 28 may determine the presence or absence of the conduction angle control and the type thereof adequately with a simple circuit.

In the above-described embodiment, the respective comparators 81 and 82 are provided in the control unit 21. For example, the respective comparators 81 and 82 may be provided outside of the control unit 21 so as to input the respective output signals S1 and S2 to the control unit 21. For example, the determining unit 83 may be provided outside of the control unit 21. For example, the detection circuit 28 may be provided outside of the control unit 21.

In the above-described embodiment, the lighting load 12 is illustrated as the load. However, the embodiment is not limited thereto, and, for example, an arbitrary load requiring the conduction angle control such as a heater is also applicable. In the above-described embodiment, the power circuit 14 used in the luminaire 10 is illustrated as the power supply circuit. However, the embodiment is not limited thereto, and an arbitrary power supply circuit corresponding to the load requiring the conduction angle control is also applicable. The voltage to be converted by the power converter 20 is not limited to the DC voltage and, for example, an AC voltage having a different effective value and a pulsed voltage are also applicable. The voltage to be converted by the power converter 20 may be set in accordance with the load to be connected, for example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A detection circuit comprising:
   a first comparator including:
      a first input terminal configured to input an AC or pulsed first detection voltage on the basis of an AC voltage;
      a second input terminal configured to input a first threshold voltage; and
      a first output terminal configured to output a first output signal having a first state indicating that the first detection voltage is lower than the first threshold voltage and a second state indicating that the first detection voltage is not lower than the first threshold voltage;
   a second comparator including:
      a third input terminal configured to input an AC or pulsed second detection voltage on the basis of the AC voltage;
      a fourth input terminal configured to input a second threshold voltage higher than the first threshold voltage; and
      a second output terminal configured to output a second output signal having a third state indicating that the second detection voltage is lower than the second threshold voltage and a fourth state indicating that the second detection voltage is not lower than the second threshold voltage; and
   a determining unit configured to determine the presence or absence of conduction angle control of the AC voltage and whether the conduction angle control is a phase control system or an opposite phase control system on the basis of a time difference between the first output signal and the second output signal.

2. The circuit according to claim 1, wherein the determining unit performs the determination on the basis of a first time difference between a first switching point at which the first output signal is switched from the first state to the second state and a second switching point at which the second output signals is switched from the third state to the fourth state, and a second time difference between a third switching point at which the second output signal is switched from the fourth state to the third state and a fourth switching point at which the first output signal is switched from the second state to the first state.

3. The circuit according to claim 2, wherein the determining unit determines that the conduction angle control is not performed when the first time difference and the second time difference are respectively not smaller than a predetermined value.

4. The circuit according to claim 2, wherein the determining unit determines that the conduction angle control of the phase control system is performed when the first time difference is smaller than a predetermined value and the second time difference is not smaller than the predetermined value.

5. The circuit according to claim 2, wherein the determining unit determines that the conduction angle control of the opposite phase control system is performed when the first time difference is not smaller than a predetermined value and the second time difference is smaller than the predetermined value.

6. A power circuit comprising:
   a detection circuit including:
      a first comparator including:
         a first input terminal configured to input an AC or pulsed first detection voltage on the basis of an AC voltage;
         a second input terminal configured to input a first threshold voltage; and
         a first output terminal configured to output a first output signal having a first state indicating that the first detection voltage is lower than the first threshold voltage and a second state indicating that the first detection voltage is not lower than the first threshold voltage;
      a second comparator including:
         a third input terminal configured to input an AC or pulsed second detection voltage on the basis of the AC voltage;

a fourth input terminal configured to input a second threshold voltage higher than the first threshold voltage; and a second output terminal configured to output a second output signal having a third state indicating that the second detection voltage is lower than the second threshold voltage and a fourth state indicating that the second detection voltage is not lower than the second threshold voltage; and a determining unit configured to determine the presence or absence of conduction angle control of the AC voltage and whether the conduction angle control is a phase control system or an opposite phase control system on the basis of a time difference between the first output signal and the second output signal;

a power converter configured to convert the AC voltage to a different voltage and supply the voltage after the conversion to a load; and a control unit configured to detect a conduction angle of the AC voltage on the basis of the result of the determination by the determining unit and control the conversion of the voltage by the power converter in accordance with the detected conduction angle.

7. The circuit according to claim 6, further comprising:

a current regulating unit having a bifurcated route electrically connected to a power supply route configured to supply the AC voltage and capable of switching between a first route state in which part of the current flowing through the power supply route is flowed through the bifurcated route and a second route state in which the current flowing in the bifurcated route is smaller than that in the first route state, wherein the control unit sets the current regulating unit to the first route state when the AC voltage is lower than a lower limit value and sets the current regulating unit to the second route state when the AC voltage is not lower than the lower limit value.

8. The circuit according to claim 7, wherein the control unit sets the timing to switch the current regulating unit from the first route state to the second route state to be a first minute time later than the timing at which the voltage value of the first detection voltage is switched from the state of lower than the first threshold voltage to the state of not lower than the first threshold voltage when the determining unit determines that the conduction angle control is not performed.

9. The circuit according to claim 7, wherein the control unit sets the timing to switch the current regulating unit from the first route state to the second route state to be a second minute time later than the timing at which the voltage value of the first detection voltage is switched from the state of lower than the first threshold voltage to the state of not lower than the first threshold voltage when the determining unit determines the conduction angle control of the phase control system.

10. The circuit according to claim 7, wherein the control unit sets the timing to switch the current regulating unit from the second route state to the first route state to be a third minute time earlier than the timing at which the voltage value of the first detection voltage is switched from the state of not lower than the first threshold voltage to the state of lower than the first threshold voltage when the determining unit determines the conduction angle control of the opposite phase control system.

11. The circuit according to claim 7, further comprising a filter capacitor connected to the power supply route.

12. The circuit according to claim 6, wherein the power converter includes:

a rectifying circuit configured to rectify the AC voltage;

a smoothing capacitor configured to convert the voltage rectified by the rectifying circuit into a first DC voltage; and a DC voltage converter configured to convert the first DC voltage to a second DC voltage and supply the second DC voltage into a load.

13. The circuit according to claim 12, wherein a ground of the control unit is shared with a ground of the DC voltage converter on the output side.

14. The circuit according to claim 6, further comprising a control power unit configured to convert the AC voltage into a drive voltage corresponding to the control unit and supply the drive voltage to the control unit.

15. The circuit according to claim 6, wherein the determining unit performs the determination on the basis of a first time difference between a first switching point at which the first output signal is switched from the first state to the second state and a second switching point at which the second output signal is switched from the third state to the fourth state, and a second time difference between a third switching point at which the second output signal is switched from the fourth state to the third state and a fourth switching point at which the first output signal is switched from the second state to the first state.

16. The circuit according to claim 15, wherein the determining unit determines that the conduction angle control is not performed when the first time difference and the second time difference are respectively not lower than a predetermined value.

17. The circuit according to claim 16, wherein the determining unit determines that the conduction angle control of the phase control system is performed when the first time difference is smaller than a predetermined value and the second time difference is not smaller than the predetermined value.

18. The circuit according to claim 16, wherein the determining unit determines that the conduction angle control of the opposite phase control system is performed when the first time difference is not smaller than a predetermined value and the second time difference is smaller than the predetermined value.

19. A luminaire comprising:

a lighting load including an illumination light source;

a power circuit, the power circuit including:

a detection circuit, the detection circuit including:

a first comparator including:

a first input terminal configured to input an AC or pulsed first detection voltage on the basis of an AC voltage;

a second input terminal configured to input a first threshold voltage; and a first output terminal configured to output a first output signal having a first state indicating that the first detection voltage is lower than the first threshold voltage and a second state indicating that the first detection voltage is not lower than the first threshold voltage;

a second comparator including:

a third input terminal configured to input an AC or pulsed second detection voltage on the basis of the AC voltage;

a fourth input terminal configured to input a second threshold voltage higher than the first threshold voltage; and a second output terminal configured to output a second output signal having a third state indicating that the second detection voltage is lower than the second threshold voltage and a fourth state indicating that the second detection voltage is not lower than the second threshold voltage; and a determining unit configured to determine the presence or absence of conduction angle control of the AC voltage and whether the conduction angle control is a phase control system or an opposite phase control system on the basis of a time difference between the first output signal and the second output signal;

a power converter configured to convert the AC voltage to a different voltage and supply the voltage after the conversion to the lighting load; and a control unit configured to detect a conduction angle of the AC voltage on the basis of the result of the determination by the determining unit and control the conversion of the voltage by the power converter in accordance with the detected conduction angle.

20. The luminaire according to claim 19, wherein the illumination light source is a light-emitting diode.

* * * * *